(12) United States Patent
Fehrer et al.

(10) Patent No.: US 9,508,903 B2
(45) Date of Patent: Nov. 29, 2016

(54) OPTOELECTRONIC COMPONENT AND METHOD FOR PRODUCING AN OPTOELECTRONIC COMPONENT

(75) Inventors: Michael Fehrer, Bad Abbach (DE); Alfred Lell, Maxhütte-Haidhof (DE); Martin Müller, Bernhardswald (DE); Tilman Schlenker, Nittendorf (DE); Sönke Tautz, Tegernheim (DE); Uwe Strauβ, Bad Abbach (DE)

(73) Assignee: OSRAM Opto Semiconductors GmbH (DE)

( * ) Notice: Subject to any disclaimer, the term of this patent is extended or adjusted under 35 U.S.C. 154(b) by 154 days.

(21) Appl. No.: 13/516,915

(22) PCT Filed: Nov. 30, 2010

(86) PCT No.: PCT/EP2010/068548
§ 371 (c)(1),
(2), (4) Date: Sep. 10, 2012

(87) PCT Pub. No.: WO2011/073027
PCT Pub. Date: Jun. 23, 2011

(65) Prior Publication Data
US 2012/0326178 A1 Dec. 27, 2012

(30) Foreign Application Priority Data
Dec. 18, 2009 (DE) .................. 10 2009 058 796

(51) Int. Cl.
*H01L 23/02* (2006.01)
*H01L 33/44* (2010.01)
(Continued)

(52) U.S. Cl.
CPC ............. *H01L 33/44* (2013.01); *H01L 24/24* (2013.01); *H01L 24/48* (2013.01); *H01L 24/82* (2013.01);
(Continued)

(58) Field of Classification Search
CPC .............. H01L 51/524; H01L 33/502; H01L 21/67126; H01L 51/525; H01L 21/326; H01L 33/44; H01L 24/24; H01L 24/82; H01L 24/48
USPC ........ 257/79, 98, 94; 438/118, 127, 107, 22; 427/576
See application file for complete search history.

(56) References Cited

U.S. PATENT DOCUMENTS 5,187,547 A 2/1993 Niina et al.
5,851,849 A 12/1998 Comizzoli et al.
(Continued)

FOREIGN PATENT DOCUMENTS

CN 100551686 10/2009
DE 112004000587 3/2006
(Continued)

OTHER PUBLICATIONS

English translation of the Notification of Reasons for Refusal from the corresponding Japanese Patent Application No. 2012-543585 dispatched Mar. 10, 2014.
(Continued)

*Primary Examiner* — Kenneth Parker
*Assistant Examiner* — Bo Fan
(74) *Attorney, Agent, or Firm* — DLA Piper LLP (US)

(57) ABSTRACT

An optoelectronic component includes at least one inorganic optoelectronically active semiconductor component having an active region that emits or receives light during operation, and a sealing material applied by atomic layer deposition on at least one surface region, the sealing material covering the surface region in a hermetically impermeable manner.

10 Claims, 8 Drawing Sheets

(51) Int. Cl.
*H01L 23/00* (2006.01)
*H01L 33/00* (2010.01)
*H01S 5/02* (2006.01)
*H01S 5/20* (2006.01)

(52) U.S. Cl.
CPC .. *H01L 33/0095* (2013.01); *H01L 2224/24145* (2013.01); *H01L 2224/24226* (2013.01); *H01L 2224/484* (2013.01); *H01L 2224/48091* (2013.01); *H01L 2224/48227* (2013.01); *H01L 2224/8592* (2013.01); *H01L 2924/00014* (2013.01); *H01L 2924/0102* (2013.01); *H01L 2924/01004* (2013.01); *H01L 2924/0104* (2013.01); *H01L 2924/014* (2013.01); *H01L 2924/01005* (2013.01); *H01L 2924/01012* (2013.01); *H01L 2924/01013* (2013.01); *H01L 2924/01014* (2013.01); *H01L 2924/01023* (2013.01); *H01L 2924/01031* (2013.01); *H01L 2924/01032* (2013.01); *H01L 2924/01033* (2013.01); *H01L 2924/01038* (2013.01); *H01L 2924/01058* (2013.01); *H01L 2924/01068* (2013.01); *H01L 2924/01072* (2013.01); *H01L 2924/01073* (2013.01); *H01L 2924/01078* (2013.01); *H01L 2924/01082* (2013.01); *H01L 2924/10329* (2013.01); *H01L 2924/10336* (2013.01); *H01L 2924/12036* (2013.01); *H01L 2924/12041* (2013.01); *H01L 2924/12042* (2013.01); *H01L 2924/12043* (2013.01); *H01L 2924/181* (2013.01); *H01L 2924/3025* (2013.01); *H01S 5/02* (2013.01); *H01S 5/20* (2013.01); *H01S 2301/176* (2013.01)

(56) References Cited

U.S. PATENT DOCUMENTS

| | | | |
|---|---|---|---|
| 5,861,636 A | 1/1999 | Dutta et al. | |
| 6,576,930 B2 * | 6/2003 | Reeh | C09K 11/7718 257/100 |
| 7,078,732 B1 * | 7/2006 | Reeh | C09K 11/7718 257/89 |
| 7,126,162 B2 * | 10/2006 | Reeh | C09K 11/7718 257/100 |
| 7,405,468 B2 * | 7/2008 | Masuda | H01L 21/565 257/676 |
| 8,679,871 B2 | 3/2014 | Wakaki | |
| 2001/0052752 A1 | 12/2001 | Ghosh et al. | |
| 2004/0197527 A1 | 10/2004 | Maula et al. | |
| 2005/0057641 A1 | 3/2005 | Ogihara et al. | |
| 2005/0112874 A1 | 5/2005 | Skarp et al. | |
| 2007/0004080 A1 | 1/2007 | Ouyang | |
| 2008/0023716 A1 | 1/2008 | Sagimori et al. | |
| 2008/0128721 A1 | 6/2008 | Watanabe et al. | |
| 2008/0128733 A1 * | 6/2008 | Yoo | H01L 33/44 257/98 |
| 2008/0241421 A1 | 10/2008 | Chen et al. | |
| 2008/0315334 A1 * | 12/2008 | Martin | H01L 23/291 257/415 |
| 2009/0101919 A1 | 4/2009 | Yao | |
| 2010/0301355 A1 | 12/2010 | Wegleiter et al. | |

FOREIGN PATENT DOCUMENTS

| | | |
|---|---|---|
| DE | 10 2008 019 902 A1 | 6/2009 |
| DE | 102009033686 | 1/2011 |
| GB | 2 295 722 | 6/1996 |
| GB | 2 447 091 A | 9/2008 |
| JP | 1-286345 | 11/1989 |
| JP | 5-318826 | 12/1993 |
| JP | 2002-208739 | 7/2002 |
| JP | 2004-095765 | 3/2004 |
| JP | 2004-165667 | 6/2004 |
| JP | 2005-019946 | 1/2005 |
| JP | 2005-057073 | 3/2005 |
| JP | 2005-093649 | 4/2005 |
| JP | 2008-028322 | 2/2008 |
| JP | 2008-515208 | 5/2008 |
| JP | 2009-010215 | 1/2009 |
| JP | 2009-55006 | 3/2009 |
| JP | 2009-076896 | 4/2009 |
| JP | 2009-252798 | 10/2009 |
| TW | 200837976 | 9/2008 |
| WO | 01/67504 A1 | 9/2001 |
| WO | 2008/107654 A1 | 9/2008 |
| WO | 2009/048799 | 4/2009 |
| WO | 2009/061704 A2 | 5/2009 |
| WO | 2011006719 | 1/2011 |

OTHER PUBLICATIONS

Richard K. Ulrich et al., "PEVCD Silicon Nitride Postbond Films for Protecting Bondpads, Bonds and Bondwires from Corrosion Failure," Proceedings, 41st Electronic Components and Technology Conference, 1991, ISBN: 0780300122, pp. 738-744.

Masanobu Okayasu et al., "Facet oxidation of InGaAs/GaAs strained quantum-well lasers," J. Appl. Phys., vol. 69, 1991, pp. 8346-8351.

Shigetoshi Ito et al., "AlGaInN violet laser diodes grown on GaN substrates with low aspect ratio," Phys. Sat. Sol. (1), 200, No. 1, 2003, pp. 131-134.

Thomas Schoedl et al., "Facet degradation of (Al,In)GaN heterostructure laser diodes," Phys. Stat. Sol. (a), 201, No. 12, 2004, pp. 2635-2638.

T. Mukai et al., "Current status and future prospects of GaN-based LEDs and LDs," Phys. Stat. Sol. (a), 201, No. 12, 2004, pp. 2712-2716.

V. Kümmler et al., "Gradual facet degradation of (Al,In)GaN quantum well lasers," Applied Physics Letters, vol. 84, No. 16, 2004, pp. 2989-2991.

T.M. Smeeton et al., "Atomic force microscopy of cleaved facets in III-V-Nitride Laser Diodes grown on free-standing GaN substrates," Applied Physics Letters, vol. 88, 041910, 2006, pp. 1-3.

J.L. Van Hemmen et al., "Plasma and Therma ALD of AL203 in a Commercial 200 mm ALD Reactor," Journal of the Electrochemical Society Bd. 154, 2007, pp. G165-G169.

English translation of the Chinese Notification of the First Office Action dated May 7, 2014 from corresponding Chinese Application No. 201080057782.2.

English translation of Search Report of corresponding CN Application No. 201080057782.2 dated Nov. 30, 2010.

English translation of Search Report dated Sep. 24, 2015 of corresponding Chinese Patent Application No. 201080057782.2.

English translation of the Notification of Reasons for Refusal dated Aug. 31, 2015 of corresponding Japanese Application No. 2015-042063.

* cited by examiner

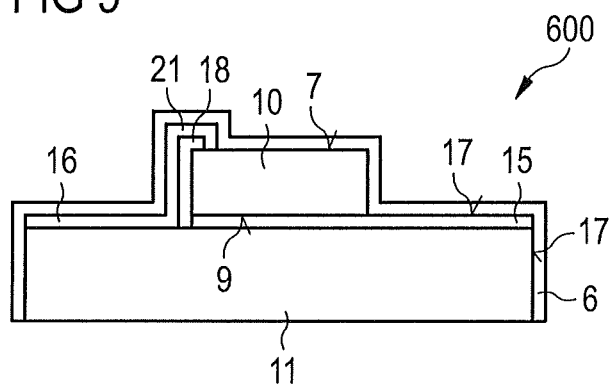
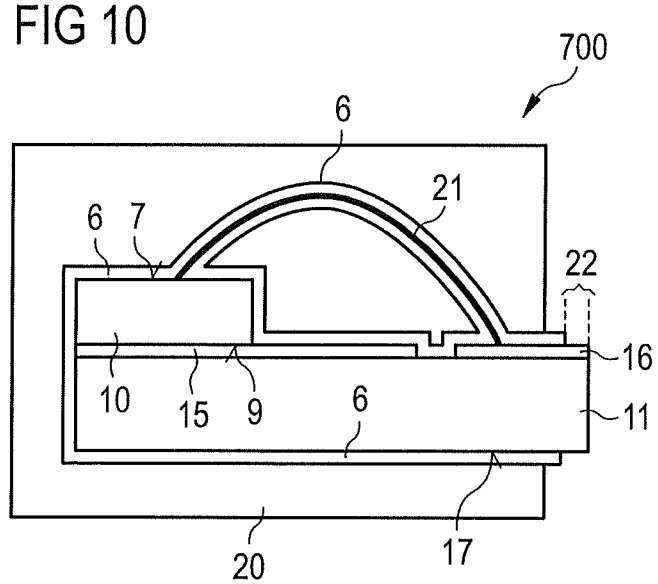

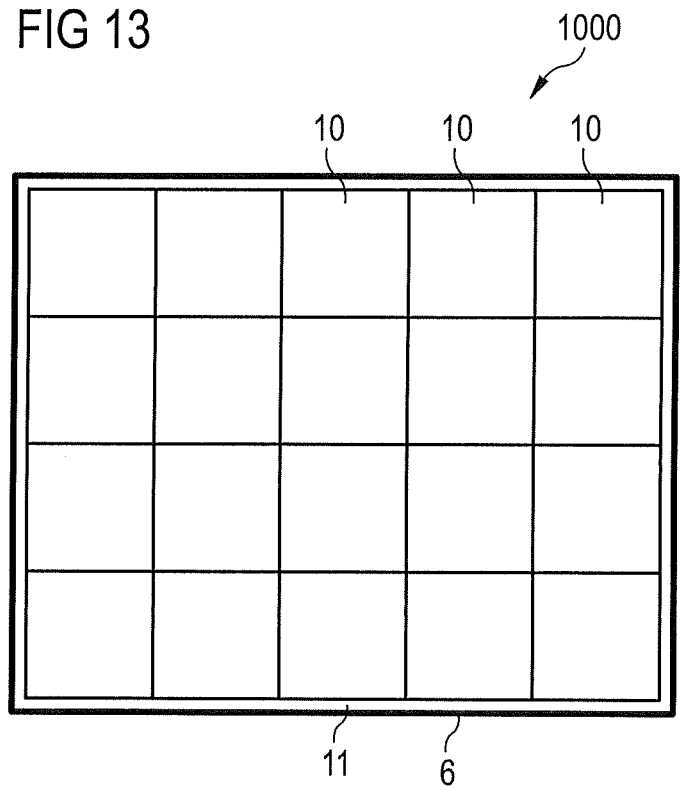

OPTOELECTRONIC COMPONENT AND METHOD FOR PRODUCING AN OPTOELECTRONIC COMPONENT

RELATED APPLICATIONS

This is a §371 of International Application No. PCT/EP2010/068548, with an international filing date of Nov. 30, 2010 (WO 2011/073027, published Jun. 23, 2011), which is based on German Patent Application No. 10 2009 058 796.9, filed Dec. 18, 2009, the subject matter of which is incorporated by reference.

TECHNICAL FIELD

This disclosure relates to an optoelectronic component and a method for producing an optoelectronic component.

BACKGROUND

Optoelectronic semiconductor components such as light-emitting diodes (LEDs), edge emitting lasers, vertically emitting lasers (VCSELs), laser arrays, photodiodes, solar cells, phototransistors, etc., are increasingly being used as key components in lighting technology, projection, data storage, printing technology, energy production and many other applications.

On the basis of the material systems AlInGaN, InGaAlP and AlGaAs, the entire spectral range from the ultraviolet through to the infrared can be covered for emitting or detecting semiconductor components. Particularly light sources based on the semiconductor systems mentioned have advantages with regard to their compactness and long lifetime in comparison with competing solution approaches such as, for instance, incandescent lamps or halogen light sources.

Innovative technological developments such as, for example, the integration of LED or laser projection units in a mobile telephone or into the backlighting of projection screens in this case require ever more compact and, in particular, flatter designs which, in addition, are intended to be producible in a cost-effective manner. In this case, present-day technologies are encountering their limits since the ultracompact, long-life semiconductor light sources or receivers which at the same time can be produced in a cost-effective manner, as demanded by the market, cannot be adequately realized using present-day conventional technologies.

Semiconductor components operated without protection under atmospheric conditions tend towards increased failure rates. Thus, investigations have been able to demonstrate that oxygen and/or moisture on semiconductor surfaces lead(s) to degradation of the corresponding components.

As described in M. Okayasu et al., "Facet oxidation of InGaAs/GaAs strained quantum-well lasers", J. Appl. Phys., vol. 69, p. 8346 (1991), for example, in the case of edge emitting GaAs lasers, the light-induced oxidation of the laser facet leads to absorption losses and, hence, to thermal heating which can ultimately lead to the thermal destruction of the laser facet ("catastrophic optical damage") and thus to component failure.

In the case of AlInGaN lasers having an emission range near a wavelength of 400 nm, intensified degradation of the components has been observed during operation in moisture, as described in V. Kümmler et al., "Gradual facet degradation of (Al,In)GaN quantum well lasers," Appl. Phys. Lett., vol. 84(16), p. 2989 (2004) and T. Schodl et al., "Facet degradation of (Al,In)GaN heterostructure laser diodes," Phys. Stat. Sol. (a), vol. 201(12), p. 2635-2638 (2004).

Investigations by atomic force microscopy, as described in T. M. Smeeton et al., "Atomic force microscopy of cleaved facets in III-V-Nitride Laser Diodes grown on free-standing GaN substrates," Appl. Phys. Lett., vol. 88, 041910 (2006), demonstrated, at degraded laser facets of the group III nitrides, formation of oxide layers, the thickness of which is dependent on the respective composition of the underlying semiconductor layer.

To reduce the disturbing environmental influences in the case of LEDs of the material systems AlGaAs, InGaAlP and AlInGaN, the latter are generally adhesively bonded by conductive adhesives on leadframes and potted with a silicone or epoxy resin, but various problems can lead to failures. Thus, there is the risk, for example, of leakage current paths arising at chip or mesa edges, in particular in the region of the pn junction, which leakage current paths can lead to ageing effects or failures as a result of electrostatic discharges, that is to say so-called ESD failures (ESD: "electrostatic discharge"). Damage of this type can be brought about, for example, by migration of metal particles from the conductive adhesive.

To combat this problem in the case of LEDs, the critical side areas of the active zone are often etched using so-called "mesa" technology and protected by dielectric passivation layers. Coating methods such as vapor deposition, sputtering or chemical vapor deposition (CVD) are used in that case.

However, layers deposited by the above methods that are usually used have the disadvantage, for example, that uniformly fashioning a formation over steep and in part irregularly shaped flanks from all sides is thereby possible only to an inadequate extent. In addition, the deposited layers often have microcavities on account of incorporated residual gases, impurities or incorporated voids. Owing to these porous structures of passivation or mirror layers, oxygen and moisture, for example, can reach the critical semiconductor surface and lead to component failures described above.

In the case, too, of semiconductor lasers of the conventional material systems AlGaAs, InGaAlP and AlInGaN, antireflection layers, passivation layers or dielectric highly reflective layers are generally applied to the sensitive laser facets. This coating is generally effected by vapor deposition, sputtering or chemical vapor deposition of the coating materials as described for instance in T. Mukai et al., "Current status and future prospects of GaN-based LEDs and LDs," Phys. Stat. Sol (a), vol. 201(12), p. 2712-2716 (2004) and S. Ito et al., "AlGaInN violet laser diodes grown on GaN substrates with low aspect ratio," Phys. Stat. Sol. (a), vol. 200(1), p 131-134 (2003).

To avoid failures owing to moisture or oxygen in the case of laser diodes, AlInGaN laser diodes, for example, are packaged in hermetically impermeable TO-based housings such as, for instance, the housing types TO38, TO56 and TO90, under inert gas. What is disadvantageous about that method is, first, the high mounting outlay associated with additional costs and, second, the risk that damage and, hence, failure of the laser diode cannot be prevented owing to permeabilities of the housing and/or residual moisture in the housing.

Such a cost-intensive and often inadequate measure for packaging laser diodes in a hermetically impermeable housing to thus increase component stability has the additional considerable disadvantage that this is associated with limited compactness with regard to design size and low flexibility with regard to integration of other optical components.

It could therefore be helpful to provide an optoelectronic component in which disadvantages mentioned above can be avoided to provide a method for producing an optoelectronic component.

SUMMARY

We provide an optoelectronic component including at least one inorganic optoelectronically active semiconductor component having an active region that emits or receives light during operation, and a sealing material applied by atomic layer deposition on at least one surface region, the sealing material covering the surface region in a hermetically impermeable manner.

We also provide a method for producing the optoelectronic component including a semiconductor component, including applying the sealing material to a semiconductor layer assemblage by atomic layer deposition, and singulating the semiconductor layer assemblage into a plurality of semiconductor components.

We further provide a method for producing the optoelectronic component including a semiconductor component, including mounting the semiconductor component on a carrier, and depositing the sealing material by atomic layer deposition.

BRIEF DESCRIPTION OF THE DRAWINGS

FIGS. 9 to 13 show schematic illustrations of optoelectronic components in accordance with further examples.

DETAILED DESCRIPTION

Figure 1A:
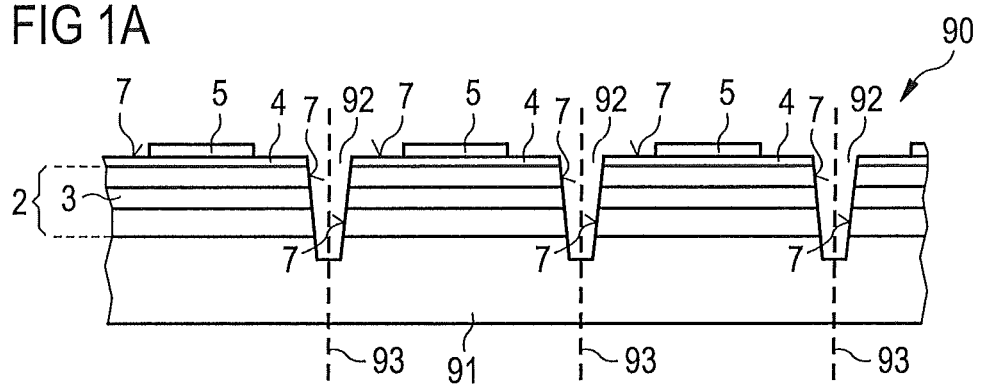
FIGS. 1A to 1D show a schematic illustration of a method for producing an optoelectronic component in accordance with one example.
Figure 1B:
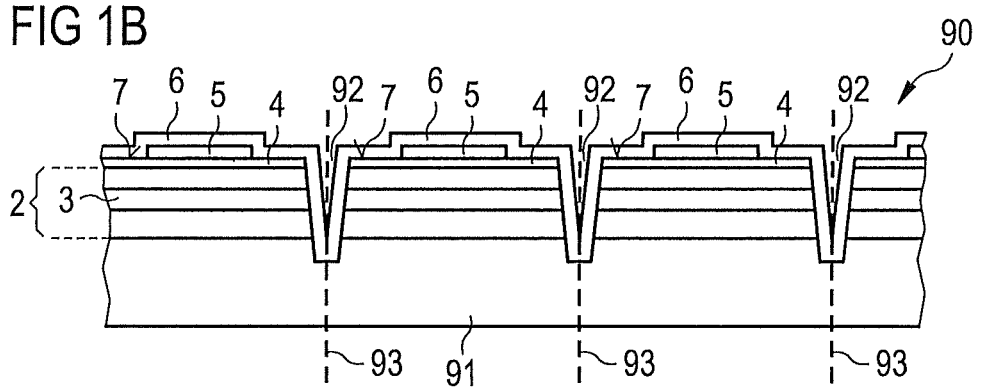

We provide an optoelectronic component which may comprise, in particular, at least one inorganic optoelectronically active semiconductor component having an active region suitable for emitting or receiving light during operation. The semiconductor component has at least one surface region on which a sealing material is applied by atomic layer deposition, the sealing material covering the surface region in a hermetically impermeable manner.

"Light" means, in particular, electromagnetic radiation in an ultraviolet to infrared spectral range, that is to say, for example, but not exclusively in a visible spectral range.

The inorganic optoelectronically active semiconductor component can, in particular, emit light during operation and, for this purpose, comprise a light-emitting diode (LED), an edge emitting semiconductor laser, a vertically emitting semiconductor laser (VCSEL), a laser array or a plurality or combination thereof or be one of the components mentioned. Alternatively or additionally, the inorganic optoelectronically active semiconductor component can receive light during operation and, for this purpose, comprise a photodiode, a solar cell, a solar cell panel, a phototransistor or a plurality or combination thereof or be one of the components mentioned. For this purpose, the semiconductor component can comprise one or a plurality of functional semiconductor layer sequences composed of a binary, ternary or quaternary III-V compound semiconductor system selected from the material groups AlGaAs, InGaAlP, AlInGaN or composed of a II-VI compound semiconductor system or some other semiconductor material. The semiconductor layer sequence can comprise at least one light-emitting or light-detecting active region such as, for instance, a pn junction, a double heterostructure, a single quantum well structure (SQW structure) or a multiple quantum well structure (MQW structure), and also electrical contact layers such as metal layers, for instance. Such semiconductor layer sequences and structures are known and, therefore, will not be explained in further detail.

The surface region to which the sealing material is applied can comprise in particular, for example, a laser facet in the case of a semiconductor component embodied as a semiconductor laser, or else an exposed pn junction of an LED, a laser diode or a photodiode, which are particularly sensitive to environmental influences and other ageing effects.

With the sealing material the surface region is covered in a hermetically impermeable manner and thereby sealed and encapsulated. That can mean that, for example, moisture and/or oxygen cannot penetrate through the encapsulation arrangement. In particular, the sealing material can form a hermetically impermeable sealing layer on the surface region of the semiconductor component which protects the semiconductor component against moisture and/or oxygen such that moisture and/or oxygen from the surrounding atmosphere cannot penetrate into the semiconductor component via the surface region and impair and damage the semiconductor component in terms of its functionality and/ or composition. Alongside the protection against moisture and/or oxygen, the sealing material can also afford protection by an effective barrier against other environmental influences and, in particular, further atomic or molecular materials.

Furthermore, the hermetically impermeable sealing material applied by atomic layer deposition can have, in comparison with layers applied by other methods such as, for instance, CVD, sputtering or vapor deposition, with comparable thickness and materials, an increased mechanical strength and thus form, for example, increased protection against mechanical effects such as scratches, for instance.

In the case of the method of atomic layer deposition (ALD), formation of a layer composed of the sealing material on a surface or a surface region of the semiconductor component is made possible by a chemical reaction of at least two precursor substances or compounds provided in gaseous form. In comparison with conventional CVD methods, in the case of atomic layer deposition, the precursor compounds are admitted into a reaction chamber cyclically in succession. In this case, first a first one of the at least two gaseous precursor compounds is fed to the volume of the reaction chamber in which the semiconductor component is provided. The first precursor compound can adsorb on the at least one surface region. In particular, it can be advantageous in this case if the molecules of the first precursor compound adsorb irregularly and without a long-range order on the surface region and thus form an at least partly amorphous covering. After a preferably complete or almost complete covering of the at least one surface region with the first precursor compound, a second one of the at least two precursor compounds can be fed in.

The second precursor compound can react with the first precursor compound adsorbed at the surface region, as a result of which a submonolayer or at most a monolayer of the sealing material can be formed. Afterwards, the first precursor compound is once again fed in, which can deposit on the submonolayer or monolayer formed and, if appropriate, also on regions of the at least one surface region that have remained free. By further feeding-in of the second precursor compound, a further submonolayer or monolayer can be produced. Between the gas admissions of the precursor compounds, the reaction chamber can be purged with a cleaning gas, in particular an inert gas such as argon, for instance, such that, before each admission of a precursor compound, advantageously there is no longer any previous precursor compound situated in the reaction chamber. In this way, the partial reactions can be clearly separated from one another and delimited to the at least one surface region.

An essential feature of atomic layer deposition is, therefore, the self-delimiting character of the partial reaction, which means that the precursor compound of a partial reaction does not react with itself or ligands of itself, which delimits the layer growth of a partial reaction even in the case of an arbitrarily long time and quantity of gas to at most one monolayer of the sealing material on the at least one surface region. Depending on method parameters and reaction chamber and also depending on the material of the sealing material or the precursor compounds, one cycle can last between a few milliseconds and a few seconds in which case a layer of the sealing material having a thickness of approximately 0.1 to approximately 3 angstroms can be produced per cycle.

The sealing material can be applied by atomic layer deposition with a thickness of greater than or equal to 1 nanometer, preferably of greater than or equal to 5 nanometers, and particularly preferably of greater than or equal to 10 nanometers, and less than or equal to 500 nm. In particular, the sealing material can have a thickness of less than or equal to 200 nanometers, preferably less than or equal to 100 nanometers, and particularly preferably of less than or equal to 50 nanometers. That can mean that the sealing material forms a layer composed of greater than or equal to 1 monolayer, preferably greater than or equal to 10 monolayers, and less than or equal to 5000 monolayers. By virtue of the high density and layer quality with which the sealing material is applied, such a thickness can be sufficient to ensure effective protection against moisture and/or oxygen for the underlying at least one surface region of the semiconductor component. The smaller the thickness of the sealing material, the lower the expenditure in respect of time and material for the production of the layer composed of the sealing material, as a result of which a high economic viability can arise. The thicker the layer composed of the sealing material, the more resistant the sealing material can be toward mechanical impairments, for example, and the greater can be the durability of the hermetic encapsulation property of the sealing material.

The sealing material applied in the manner described initially and covering the at least one surface region has the advantage that the layer thickness of the sealing layer thus produced is dependent only on the number of reaction cycles which enables exact and simple control of the layer thickness. Furthermore, this advantageously results in only minor requirements made of the homogeneity of the respective gas flow with which the precursor compounds are fed to the reaction chamber such that the sealing material can particularly advantageously be applied homogeneously and uniformly in particular also on large areas.

As a result of the separate addition and metering of the precursor compounds, reactions as early as in the gas phase are prevented such that even highly reactive precursor compounds that cannot be used in the case of methods such as vapor deposition or CVD, for example, can be employed. As a result of the above-described sequence and fixed metering, enough time for completion remains for each reaction step which advantageously enables high-purity layers composed of the sealing material even at relatively low process temperatures. Furthermore, adsorption of the first precursor compound and the subsequent chemical reaction with the second precursor compound take place on the entire surface accessible to the gases such that the surface is increasingly covered by a formation and sealed substantially independently of its geometrical constitution and possibly present particles, openings such as, for instance, so-called "pinholes" and holes by the successive reaction cycles.

Furthermore, in comparison with layers produced by other methods such as sputtering, vapor deposition or CVD, the sealing material can be produced in a defect-free manner on the at least one surface region. That means that, for example, there are no pinholes or microchannels in the sealing material through which moisture and/or oxygen and/or other atomic or molecular materials can migrate through the sealing material to the at least one surface region.

The sealing material is preferably electrically insulating and optically transparent and can comprise, for example, an oxide, nitride or oxynitride, for example, comprising one or more selected from aluminium, silicon, titanium, zirconium, tantalum and hafnium. In particular, the sealing material can comprise one or more of the following materials: $Al_2O_3$, $SiO_2$, $Si_3N_4$, $TiO_2$, $ZrO_2$, $Ta_2O_5$, $HfO_2$, $Y_2O_3$. Examples of suitable precursor compounds include organometallic compounds or hydrides of the materials mentioned and also, for example, ammonia, nitrous oxide or water as precursor compound for oxygen or nitrogen.

To achieve a maximally effective encapsulation of the semiconductor component by the sealing material, it can be advantageous if the at least one surface region covered by the sealing material comprises one or a plurality of upper, lower and/or side areas of the semiconductor component.

Furthermore, the semiconductor component can have at least one electrical contact layer suitable for electrically connecting the semiconductor component. The electrical contact layer can comprise or be one or a plurality of metal layers, for example. In this case, the at least one surface region can comprise all exposed surfaces of the semiconductor component apart from the contact layer or apart from a partial region of the contact layer. In other words, the sealing material can in this case completely cover all exposed surfaces of the semiconductor component apart from the contact layer or apart from a partial region of the contact layer. It is thereby possible to achieve a sealing and encapsulation of the exposed surfaces of the semiconductor component, wherein the electrical contact layer can still be electrically contact-connected after the sealing material has been applied.

"Exposed" surfaces denote such surfaces and surface regions which, after completion of the optoelectronic component, can have contact with the surroundings in the form that, for example, atomic or molecular substances from the surroundings, for instance oxygen and moisture, can pass to the surface. Therefore, a surface or a surface region covered by a layer that is not hermetically impermeable, for instance an oxygen- and/or water-permeable plastic layer, can in this case also come under the term exposed. In particular, a surface or a surface region is not exposed within the meaning employed here when the optoelectronic component has a carrier and the surface or the surface region serves for mounting the semiconductor component onto a carrier and is therefore embodied as a mounting area.

In particular, the semiconductor component can be applied with a mounting area on a carrier. The carrier can comprise or be, for example, a heat sink, a circuit board, a leadframe, a housing body or a combination thereof. The semiconductor component can be mechanically mounted on the carrier by the mounting area, for example, by soldering, anodic bonding or adhesive bonding. In addition, the semiconductor component can also be electrically connected to the carrier by the mounting area, wherein the mounting area can then additionally be an electrical contact layer.

In the case of a semiconductor component applied on a carrier, the at least one surface region covered in a hermetically impermeable manner by the sealing material can comprise all exposed surfaces of the semiconductor component, in particular all surfaces apart from the mounting area such that the sealing material covers all exposed surfaces of the semiconductor component. In this example, the semiconductor component is enclosed by the sealing material on all sides apart from the mounting area such that an effective encapsulation of the semiconductor component is made possible.

Furthermore, the semiconductor component can additionally be connected to the carrier by an electrical contact element. For this purpose, the semiconductor component can have an electrical contact layer on a surface different from the mounting area, the electrical contact element being connected to the electrical contact layer. The electrical contact element can be a bonding wire or a metal layer, for example. Furthermore, the electrical contact element can particularly advantageously be covered by the sealing material together with the electrical contact layer of the semiconductor component.

Furthermore, the sealing material can cover at least one part of a surface of the carrier. In particular, the sealing material can extend continuously from the surface of the carrier to the at least one surface region of the semiconductor component such that the sealing material can also cover the mounting region between the semiconductor component and the carrier.

Furthermore, the carrier can have an electrical connection region by which the optoelectronic component can be connected to a control circuit or a power supply, for example. In this case, the sealing material can cover all exposed surfaces of the semiconductor component and of the carrier apart from the connection region of the carrier such that the carrier together with the semiconductor component is covered with the sealing material in a hermetically impermeable manner on all surfaces apart from the connection region of the carrier.

Furthermore, the semiconductor component and the sealing material can be at least partly enclosed with a housing material. The housing material can be, for example, a plastic and in particular a transparent plastic. Since the sealing material covers the at least one surface region of the semiconductor component in a hermetically impermeable manner, it is advantageously possible that the housing material itself is not hermetically impermeable and can be chosen solely according to other aspects such as, for instance, optical properties and/or mechanical properties. In particular, the housing material can additionally be at least partly formed around the carrier as well.

Furthermore, the optoelectronic component can comprise a plurality of inorganic optoelectronically active semiconductor components and additionally or alternatively one or a plurality of further electronic components. In this case, the sealing material can be applied on respectively at least one surface region of each of the plurality of semiconductor components and/or of the electronic components and in this case jointly encapsulate the plurality of semiconductor components and/or electronic components. In particular, the plurality of the semiconductor components and/or of the further electronic components on the carrier can be covered and, hence, encapsulated with a continuous, closed layer composed of the sealing material. As an alternative thereto, the continuous layer composed of the sealing material can have openings above electrical contact layers of the semiconductor components or electrical connection regions on the carrier to enable electrical contact-connection after the sealing material has been applied.

The semiconductor component can furthermore have at least one micro-opening in the at least one surface region. Such a micro-opening can be formed, for example, by a pinhole, a microchannel, a pore or a dislocation, for instance a screw dislocation, in the crystal microstructure adjoining the surface region. Such micro-openings or narrow holes can arise on account of various causes during production of the semiconductor component and are therefore technically often unavoidable, for instance owing to imperfect lattice matches between epitaxially applied layers and a growth substrate or between different epitaxially applied layers. Substrates, too, owing to the dictates of production, can have micro-openings and be pervaded by microchannels, for example. Such micro-openings in the semiconductor component pose an increased risk of failure in the case of conventional components since, through the microchannels, harmful gases or else dopants or metals can migrate into the semiconductor component or within the latter, for example, into the active region and can lead to reverse current increases or ageing failures.

The sealing material on the at least one surface region having the micro-openings can seal the latter and thus prevent atom or molecule migration within the micro-openings. This can advantageously be possible by virtue of the fact that, by atomic layer deposition, it is possible for the sealing material to be deposited homogeneously even on steep flanks and depressions, in particular even in the case of channels or pores which have a ratio of opening size to depth of up to 1:100 and in the case of which, even at the deepest point of the channel or pore, it is possible to deposit a layer having a comparable thickness to that at the surface in the region of the opening. In particular, as described initially, the surface region having the at least one micro-opening can be part of a surface of a substrate or of an epitaxially grown layer.

Furthermore, the semiconductor layer sequence can comprise a passivation layer and/or a growth protection layer. In this case, the surface region having the at least one micro-opening can be part of a surface of the passivation layer and/or of the growth protection layer which is sealed by the sealing material in a hermetically impermeable manner.

Passivation layers often have a high porosity and often also microchannels, which, by way of example, can be owing to the coating method used for applying the passivation layer itself, for example, if the average free path length of the particles to be coated during the coating process is too small to produce a perfect packing density. In addition, residual gases such as for instance, oxygen in the coating chamber can also lead to the deposition of porous structures in the passivation layer. Holes or micro-openings in a passivation layer on side areas and/or on a light coupling-out area or a laser facet of the semiconductor component can involve a high risk of failure owing to the risk of migration of metal since the associated field boosting can lead to destruction of the semiconductor component during operation. In addition, through such cavities formed by the micro-openings, moisture, oxygen and other damaging gases can pass to the surface of the semiconductor component and, for example, lead to degradation of the component voltage or of the optical power. Such risks can be avoided by the sealing material on the passivation layer.

A growth protection layer can be suitable, for example, for the structuring of the semiconductor layer sequence of the semiconductor component by epitaxial overgrowth, whereby structures can advantageously be produced in self-aligning form. Thus, by way of example, the production of narrow laser ridges with optimum depth can be achieved by virtue of the fact that the epitaxial growth is carried out only as far as a defined layer and, after application of a structured growth protection layer having an opening suitable for the ridge, further growth is effected within the opening. If the growth protection layer has micro-openings, then in the latter uncontrolled crystal growth can occur in the course of which so-called "parasitic" crystals, which can result in a poor capability of fashioning formations thereover, leakage currents and component failure. Such a risk can be avoided by the sealing material on the growth protection layer.

The surface region can furthermore be at least partly shaded. That can mean that the surface region is geometrically shaped such that it is not directly accessible at least in part for directional application methods such as vapor deposition or sputtering, for instance, which are usually used in the prior art. Therefore, during such methods, geometrically shaded regions are either not coated at all or are coated significantly more thinly. In particular, the surface region can be, for example, part of a structure on a surface of the semiconductor component which has a narrowing or indentations along the extension plane of the surface, for instance a mushroom structure or an upside-down wedge structure. Furthermore, a shaded region can also be formed by cavities or gaps. With the above-described method progression during atomic layer deposition, the sealing material can be applied homogeneously and with uniform thickness on even such shaded surface regions since the sealing material can be applied uniformly by this method independently of the geometry of the surface region of the structures to be coated or of the semiconductor component to be coated, in particular even in narrow gaps and cavities. These advantages can arise during the application of the sealing material in the chip process, in the wafer assemblage of finished processed semiconductor components, in the case of singulated semiconductor components and in the case of mounted semiconductor components.

To produce the inorganic optoelectronically active semiconductor components, a semiconductor wafer can be provided on which a semiconductor layer sequence having the active region is deposited epitaxially. The semiconductor layer sequence can furthermore also be provided with electrical contact layers. Furthermore, the semiconductor layer sequence can be structured by etching into individual regions, which form the semiconductor components after singulation and detachment from the semiconductor layer assemblage thus formed. Such a semiconductor layer assemblage of semiconductor components that have not yet been singulated is also referred to as a wafer assemblage.

In a method for producing an optoelectronic component comprising a semiconductor component as described above and comprising one or a plurality of the abovementioned features, the semiconductor layer assemblage is first singulated into individual semiconductor components on which the sealing material is then applied by atomic layer deposition.

In a further method for producing an optoelectronic component comprising a semiconductor component as described above and comprising one or a plurality of the abovementioned features, the sealing material is applied to a semiconductor layer assemblage by atomic layer deposition, the semiconductor layer assemblage then being singulated into a plurality of semiconductor components. As a result, directly after singulation, each of the semiconductor components already has the sealing material on a surface region.

The semiconductor layer assemblage can be an above-described wafer assemblage, for example. After growth of the semiconductor layer sequence and/or after an etching step, surface regions in the wafer assemblage can be exposed which can be protected and sealed by application of the sealing material. Before singulation of the wafer assemblage, sensitive surfaces and surface regions of optoelectronically active semiconductor components such as, for example, LEDs, laser diodes or photodiodes can already be protected by application of the sealing material. After application of the sealing material, semiconductor components already sealed at the critical surfaces can thus be obtained by the singulation, for example, by sawing, breaking or etching.

Furthermore, the wafer assemblage can be applied to a carrier assemblage before singulation, the carrier assemblage comprising, for example, heat sinks for subsequent semiconductor components or other carriers mentioned above. Afterwards, in the wafer assemblage, the sealing material can be applied and the individual regions that form the subsequent semiconductor components can be measured and tested in a targeted manner. Afterwards, the overall system can be singulated, whereby it is possible to obtain semiconductor components already mounted on carriers with sealing material applied. Such a so-called "batch" process in the context of the production of an optoelectronic component makes it possible to produce a multiplicity of optoelectronic components particularly cost-effectively since handling of the individual semiconductor components can be reduced to a minimum.

The semiconductor layer assemblage can also be, for example, a so-called "bar" assemblage of laser diodes. In this case, a semiconductor layer sequence produced in the wafer assemblage is suitably cleaved into bars to produce laser facets at the cleavage faces. The sealing material can then be deposited onto the laser facets. In the case of laser facets that have already been dry-etched in the wafer assemblage, it can also be possible for the laser facets already to be coated with the sealing material in the wafer assemblage as described above.

In a further method for producing an optoelectronic component comprising a semi-conductor component as described above and comprising one or a plurality of the abovementioned features, the semiconductor component is mounted on a carrier. The sealing material is then deposited by atomic layer deposition. In this case, the carrier can comprise or be a heat sink, a housing component, a leadframe or a combination thereof. It can be particularly advantageous if the semiconductor component is also electrically connected on the carrier, for example, by an electrical contact layer forming the mounting area and/or by an electrical contact element, for instance a metal layer or a bonding wire, as described above. In this case, all exposed surfaces of the semiconductor component together with at least one part of the surface of the carrier and, if appropriate, the electrical contact element can advantageously be covered with the sealing material to achieve an effective encapsulation and sealing since all critical interfaces and surfaces of the semiconductor component, for example, a facet, side edges and/or exposed chip surfaces can thereby be protected simultaneously in one sealing step. In this case, it is also particularly advantageous that there is no need to provide corresponding windows for the electrical connection of the semiconductor component, for instance by bonding or soldering, for example, by a mask technique, and/or to uncover them again by etching, for instance, after application of the sealing material since the electrical contact-connection has already been effected.

The inorganic optoelectronically active semiconductor components described here can be made resistant to environmental influences and thus be protected, for example, against mechanical loading such as, for instance, scratches, moisture and/or damaging gases such as oxygen, for instance, by the sealing material applied by atomic layer deposition. This is advantageously possible in a cost-effective manner with the methods described here. Cost-effective, innovative, ultracompact and ageing-stable optoelectronic components can be made possible as a result.

In particular, in the case of the above-described examples of the optoelectronic component and the method for producing the optoelectronic component, it can be possible, owing to the sealing material applied by atomic layer deposition, to dispense with housings filled with inert gas usually used in the prior art, and thus to achieve first a significant cost saving potential and second prevention of component-destroying fault sources such as, for instance, residual moisture in the housing or permeabilities. Furthermore it can be possible for newly innovative designs to be made possible which, on account of dispensing with the inert gas capping, allow a high degree of flexibility in relation to the respective application. In particular, optoelectronic components having an extremely compact, flat design can be made possible which, by way of example, can be suitable for being incorporated in mobile telephones as projection lasers or for the backlighting of projection units.

Further advantages and developments will become apparent from the examples described below in conjunction with FIGS. 1A to 13.

In the examples and figures, identical or identically acting constituent parts can be provided with the same reference symbols in each case. In principle, the illustrated elements and their size relationships among one another should not be regarded as true to scale; rather, individual elements such as, for example, layers, structural parts, components and regions may be illustrated with exaggerated thickness or size dimensions to enable better illustration and/or to afford a better understanding.

FIGS. 1A to 1D show a method for producing an optoelectronic component 100 comprising a semiconductor component 10 in accordance with one example.

A first method step in accordance with FIG. 1A involves providing a so-called "semiconductor layer assemblage" 90 in the form of a so-called "wafer assemblage." The semiconductor layer assemblage 90 has a semiconductor wafer 91, on which a semiconductor layer sequence 2 having an active region 3 is deposited. An electrical contact layer 4 composed of a metal, a metal layer sequence and/or a metal alloy is applied on the semiconductor layer sequence 2. In the structure shown, the electrical contact layer 4 is shown purely by way of example and can, for example, also be structured. Furthermore, one or a plurality of further electrical contact layers can be applied such that the semiconductor layer sequence 2 and, in particular, the active region 3 can be contact-connected on both sides. Such contact-connection possibilities are known and will not be explained in any further detail.

In the structure shown, the semiconductor layer assemblage 90 comprises, purely by way of example, a semiconductor layer sequence 2 for producing semiconductor components 10 which are light-emitting diodes (LEDs) and therefore has an active region 3 suitable for emitting light during operation. As an alternative thereto, the semiconductor layer assemblage 90 can, for example, also have a semiconductor layer sequence 2 for producing edge emitting laser diodes, vertically emitting laser diodes (VCSELs), laser diode arrays, photodiodes or solar cells.

In the example shown, the semiconductor layer sequence 10 comprises a III-V compound semiconductor material or a II-VI compound semiconductor material. A III-V compound semiconductor material comprises at least one element from the third main group such as, for example, B, Al, Ga, In, and an element from the fifth main group, such as, for example, N, P, As. In particular, the term III-V compound semiconductor material encompasses the group of binary, ternary or quaternary compounds containing at least one element from the third main group and at least one element from the fifth main group, for example, nitride and phosphide compound semiconductors. Such a binary, ternary or quaternary compound can additionally comprise, for example, one or a plurality of dopants and also additional constituents. Correspondingly, a II-VI compound semiconductor material comprises at least one element from the second main group such as, for example, Be, Mg, Ca, Sr, and an element from the sixth main group such as, for example, O, S, Se. In particular, a II-VI compound semiconductor material comprises a binary, ternary or quaternary compound comprising at least one element from the second main group and at least one element from the sixth main group. Such a binary, ternary or quaternary compound can additionally comprise, for example, one or a plurality of dopants and also additional constituents. By way of example, the II-VI compound semiconductor materials include: ZnO, ZnMgO, CdS, ZnCdS, MgBeO.

The semiconductor wafer 91 comprises, for example, sapphire or a semiconductor material, for example, a compound semiconductor material mentioned above. In particular, the semiconductor wafer 91 can in this case comprise or be composed of GaAs, GaP, GaN or InP, or else alternatively SiC, Si or Ge.

As an alternative to the example shown, the semiconductor wafer 91 can also be a carrier substrate instead of a growth substrate for the semiconductor layer sequence 2, to which carrier substrate the semiconductor layer sequence 2 grown on a previously provided growth substrate has been transferred. Method steps of this type are known, for example, in the context of production of so-called "thin-film semiconductor components" and will not be explained in any further detail here.

The semiconductor layer sequence 2 can have, as active region 3, for example, a conventional pn junction, a double heterostructure, a single quantum well structure (SQW structure) or a multiple quantum well structure (MQW structure). The semiconductor layer sequence 2 can comprise, besides the active region 3, further functional layers and functional regions, for instance p- or n-doped charge carrier transport layers, undoped or p- or n-doped confinement, cladding or waveguide layers, barrier layers, planarization layers, buffer layers, protective layers and/or electrodes and combinations thereof. Such structures concerning the active region 3 or the further functional layers and regions are known particularly with regard to construction, function and structure and therefore will not be explained in any greater detail.

Furthermore, the semiconductor layer assemblage 90 has trenches 92 subdividing the semiconductor layer sequence 2 into individual regions which form the semiconductor components 10 after singulation along the separating lines indicated.

A mask 5 as shown in a structured fashion is applied on the electrical contact layer 4, the mask serving for the structuring of a subsequently applied sealing material 6. The mask 5 comprises, for example, a metal, a dielectric, a photoresist, or a combination thereof.

The semiconductor layer sequence 2 has surface regions 7 comprising the top side of the semiconductor layer sequence 2 or of the electrical contact layer 4 and in particular also side areas of the semiconductor layer sequence 2 that are exposed by the trenches 92. The side areas, in particular, have to be protected against harmful influences such as damaging gases, for instance, since the individual layers of the semiconductor layer sequence 2 and in particular the active region 3 are exposed. In a subsequent method step in accordance with FIG. 1B, therefore, a sealing material 6 is applied to the surface regions 7 by the atomic layer deposition described in the general part. In the example shown, the sealing material comprises an electrically insulating, optically transparent oxide or nitride such as, for instance, titanium oxide, silicon oxide or silicon nitride or else a further material mentioned in the general part. The sealing material 6 is applied with a thickness of less than or equal to 500 nm, and preferably with a thickness of 10 nm to 100 nm. As a result of the application by atomic layer deposition, the sealing material 6 covers the surface regions 7 in a hermetically impermeable manner such that, in particular, the side areas of the semiconductor layer sequence 2 that are exposed by the trenches 92 are sealed and encapsulated in a scratch-resistant and hermetically impermeable manner. Furthermore, with the sealing material 6, in the subsequent semiconductor components 10, it is possible to avoid leakage currents by way of the side areas and chip edges, which would otherwise constitute stability risks for operation. For a semiconductor component 10 embodied as a light-receiving semiconductor component 10, leakage currents can also give rise to dark current failures.

Figure 1C:
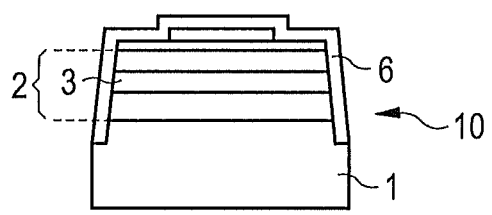

After application of the sealing material 6, the semiconductor layer assemblage 90 is singulated in the trenches 92 along the separating lines 93 by sawing, breaking, scribing and/or etching into semiconductor components 10, one of which is shown in FIG. 1C.

A lift-off technique is used to remove the mask 5 on the semiconductor component 10 (FIG. 1D), as a result of which a contact opening 8 is formed in the layer composed of the sealing material 6, through which contact opening it is possible to make contact with the electrical contact layer 4 for the electrical connection of the semiconductor component 10. As an alternative to the example shown, the mask 5 can also be removed already prior to singulation.

Figure 1D:
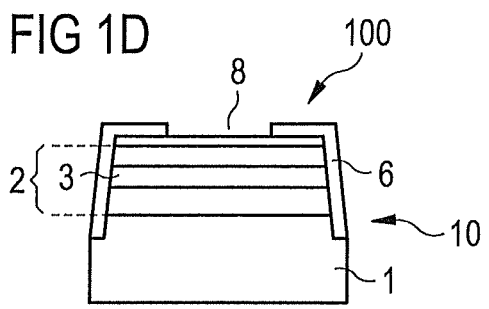

The optoelectronic component 100 produced by the method shown in accordance with FIG. 1D thus comprises a semiconductor component 10 having an active region 3 suitable for emitting light during operation. A sealing material 6 is applied on at least one surface region 7, the sealing material hermetically covering the surface region 7. In particular, in the example shown, the flanks of the semiconductor component 10 are sealed by the sealing material 6 such that, by way of example, degradation or impairment of the active region 3 by environmental influences such as, for instance, moisture and/or oxygen and/or by leakage currents can be avoided.

As an alternative to the example shown, the semiconductor layer assemblage 90 can also form, instead of a wafer assemblage, a bar assemblage of laser diodes in which, for example, the facets exposed by cleavage form surface regions 7, on which the sealing material 6 is applied.

The further figures show further examples for method steps of production methods and for optoelectronic components which constitute variations and modifications of the example shown above and which, unless described otherwise, can comprise features of the example shown above.

Figure 2A:
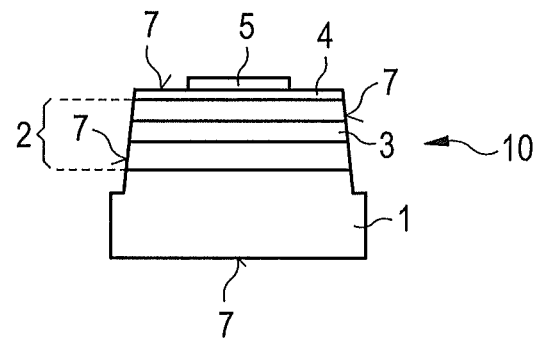
FIGS. 2A to 3 show schematic illustrations of method steps of methods for producing optoelectronic components in accordance with further examples.
Figure 2B:
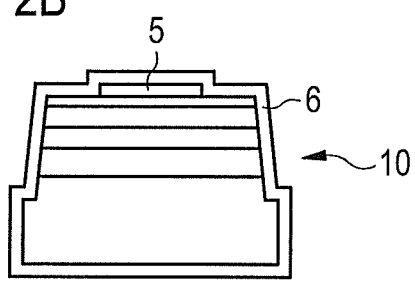
Figure 2C:
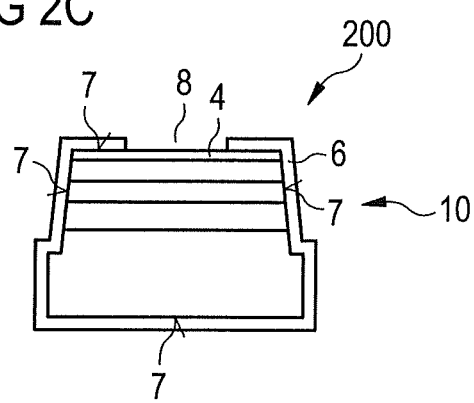

FIGS. 2A to 2C show an example of method steps for a method for producing an optoelectronic component 200 wherein singulation of the semiconductor layer assemblage 90 into semiconductor components 10 is carried out according to the method step shown in FIG. 1A. As an alternative to the method shown, by way of example, the mask 5 can also first be applied on the singulated semiconductor component 10.

In a further method step in accordance with FIG. 2B, a sealing material 6 is deposited by atomic layer deposition on all surface regions 7 of the semiconductor component 10. With the lift-off technique described above, the mask is removed and the electrical contact layer is exposed in the contact opening 8 (FIG. 2C).

The optoelectronic component 200 thus produced comprises a semiconductor component 10 wherein the surface regions 7 covered with the sealing material 6 comprise all exposed surfaces of the semiconductor component 10 apart from a partial region of the electrical contact layer 4. Consequently, the semiconductor component 10 is covered in a hermetically impermeable manner on all sides and is protected against scratching and harmful environmental influences and can also be electrically contact-connected by the electrical contact layer exposed in the contact opening 8. As already noted further above, the sealing material 6 can have further contact openings for exposing further electrical contact layers, but this is not shown for the sake of clarity.

Figure 3:
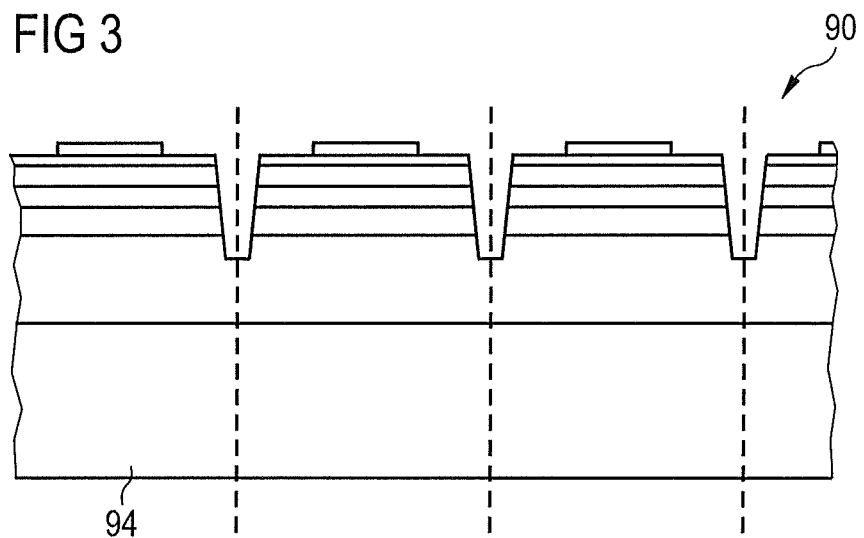

FIG. 3 shows a method step for a production method for optoelectronic components in accordance with a further example. In this case, the semiconductor layer assemblage 90 is applied to a carrier assemblage 94 comprising, for example, heat sinks for the semiconductor components 10. The semiconductor layer assemblage 90 and the carrier assemblage 94 are connected to one another and mounted one on top of the other by soldering, adhesive bonding or anodic bonding, for example.

As an alternative to the example shown, one or a plurality of already singulated semiconductor components 10 can also be mounted onto a carrier or a carrier assemblage.

The semiconductor layer assemblage 90 with the carrier assemblage 94 or one or a plurality of semiconductor components 10 on a carrier or carrier assemblage can then be processed further as in the previous examples.

Figure 4:
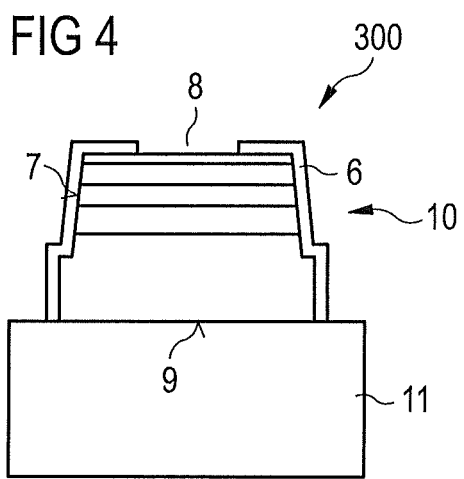
FIGS. 4 to 5B show schematic illustrations of optoelectronic components in accordance with further examples.

FIG. 4 shows an example of an optoelectronic component 300 wherein the semiconductor component 10 is mounted by a mounting area 9 on a carrier 11, for example, a heat sink, a leadframe and/or a circuit board. The surface region 7 covered with the sealing material 6 comprises, apart from the contact opening 8, all exposed surfaces of the semiconductor component 10. Depending of the specific requirements made of the optoelectronic component, for example, with regard to optimized heat dissipation and/or shading by electrical contact layers or bonding pads, production of such a component with regard to the mounting of the semiconductor component 10 on the carrier 11 can be effected using either so-called "p-side-up" mounting or "p-side-down" mounting.

As an alternative to the example shown in FIG. 4, the sealing material 6 can also be applied on all exposed surface regions 7 including the electrical contact layers 4, that is to say on all surfaces apart from the mounting area, and/or at least partly on one or a plurality of surfaces of the carrier 11, as is shown for instance in connection with FIGS. 9 to 13.

Figure 5A:
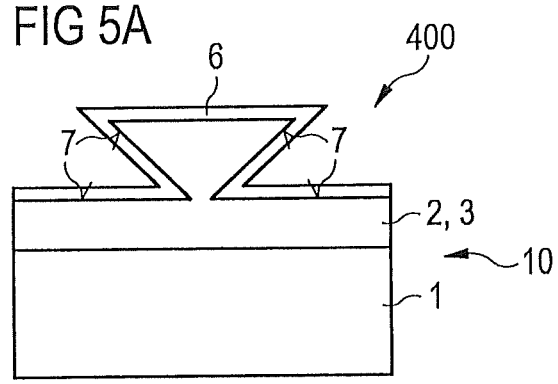
Figure 5B:
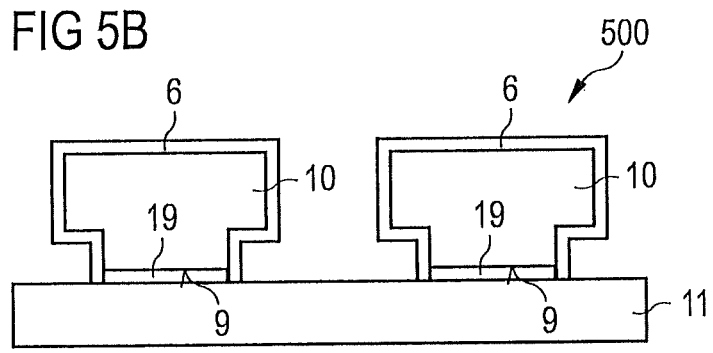

FIGS. 5A and 5B show further examples of optoelectronic components 400, 500, wherein a sealing material 6 is applied on at least one surface region 7. In both examples, the semiconductor components 10 of the optoelectronic components 400, 500 have surface regions 7 covered with the sealing material 6, the surface regions being shaded. That means that the surface regions 7 cannot be covered or at least cannot be covered uniformly with the sealing material 6 by directional application methods such as, for instance, vapor deposition or sputtering. In accordance with the examples shown, the shaded regions of the surface regions 7 are formed by geometrical shaped portions in the form of an inverted wedge structure (FIG. 5A) and in the form of mushroom-like structures (FIG. 5B) of the semiconductor components 10 and the semiconductor layer sequences 2 thereof. The geometrical shaped portions shown are purely by way of example in this case. By atomic layer deposition, it is possible to achieve a geometry-independent covering of the surface regions 7 to be coated in the examples shown, since this method is non-directional.

Particularly advantageously, the method described here can therefore also be used for semiconductor components 10 arranged very closely alongside one another on a carrier and/or which have, for example, narrow channels and/or openings and/or structures tapering towards the mounting area.

Figure 6:
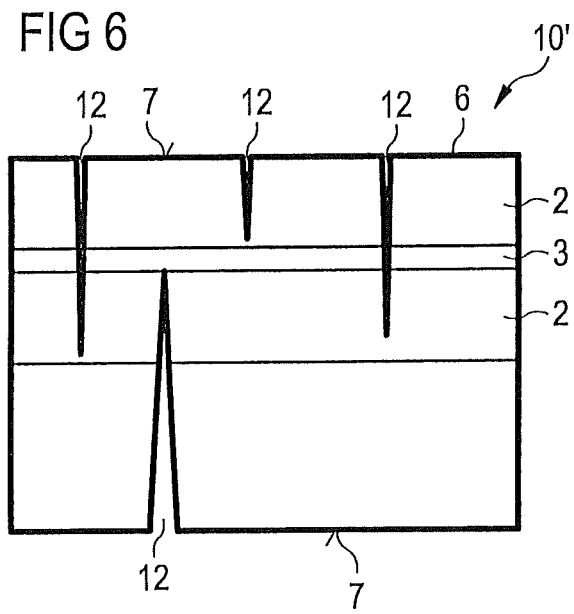
FIGS. 6 to 8 show schematic illustrations of semiconductor components for optoelectronic components in accordance with further examples.
Figure 7:
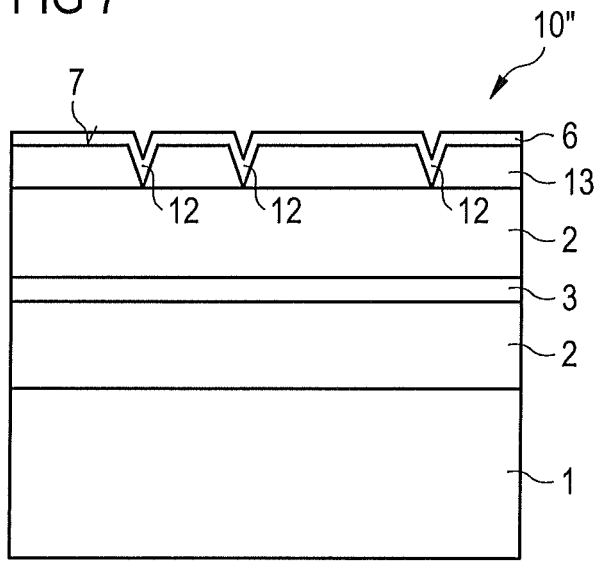
Figure 8:
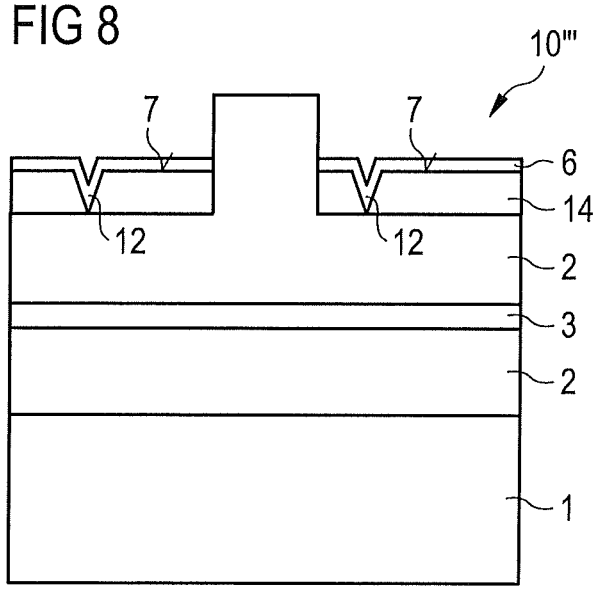

FIGS. 6 to 8 show examples of semiconductor components 10', 10", 10''' having micro-openings 12.

As indicated schematically in FIG. 6, the micro-openings 12 in the semiconductor layer sequence 2 and/or in the substrate 1 can be present, for instance, in the form of microchannels and/or screw dislocations. By way of example, such micro-openings 12 can form during application of the semiconductor layer sequence 2 on account of imperfect lattice matches between the semiconductor layer sequence 2 and the substrate 1 and/or between different layers of the semiconductor layer sequence 2. The substrate 1 can likewise have micro-openings 12 owing to the dictates of production. In particular, the optoelectronic components of the examples shown above and below can have such micro-openings.

Within the micro-openings 12, dopants and/or metal and/or moisture and/or oxygen can migrate, for example, into the active region 3 and thus lead to a reverse current rise and ageing failures. Such risks are prevented by sealing the surface regions 7, which contain the micro-openings, by the sealing material 6, as indicated in FIG. 6.

In particular, sealing the micro-openings 12 can be effected, for example, by the semiconductor layer sequence 2 being sealed by the sealing material 6 directly after epitaxial growth, or else in a later process step in accordance with the previous examples. In particular, sealing the micro-openings 12 can be effected together with a step of passivation of further surface regions 7 to be sealed, for example, the side areas of a semiconductor component 10.

As indicated in FIG. 7, the semiconductor component 10" can have a passivation layer 13 on one surface, the passivation layer being applied, for example, by a conventional application method such as, for instance, sputtering, vapor deposition or CVD. As described in the general part, such a passivation layer 13 can have micro-openings 12 such as, for instance, microchannels and/or pinholes as a result of an increased porosity and/or as a result of an imperfect area coverage of the passivation layer 13, and they can be sealed by the sealing material 6 by atomic layer deposition.

FIG. 8 shows a semiconductor component 10''' embodied as a laser diode and having a known ridge waveguide structure. The ridge waveguide structure is produced by epitaxial overgrowth in self-aligning form by a growth protection layer 14 being applied on a part of the semiconductor layer sequence 2, the growth protection layer having an opening in the region in which the ridge waveguide structure is intended to be formed. In the case of a porous growth protection layer 14 having micro-openings 12 on the surface region 7, parasitic crystals grow in the region of the micro-openings 12, which parasitic crystals can result in a poor capability of fashioning formations thereover, leakage currents and/or even component failure. The micro-openings 12 in the surface region 7 can be sealed by application of the sealing material 6 by atomic layer deposition.

FIG. 9 shows an optoelectronic component 600 comprising a semiconductor component 10 in accordance with a further example.

The optoelectronic component 600 comprises a carrier 11, which is a heat sink for a semiconductor component 10 mounted thereon and which has electrical connection layers 15, 16 for making electrical contact with the semiconductor component 10. The semiconductor component 10 is mounted by a mounting area 9 on the electrical connection layer 15, wherein the mounting area 9 is also embodied with an electrical contact layer (not shown) for electrical connection of the semiconductor component 10. On the side opposite the mounting area, the semi-conductor component 10 is electrically connected to the connection layer 16 of the carrier by an electrical contact element 21 which is an electrically conductive layer. For this purpose, an electrical insulation layer 18 is arranged in regions between the electrical contact element 21 and the semiconductor component 10 to electrically insulate the electrical contact element 21, for example, at the side areas of the semiconductor component 10 from the electrical contact element 21.

On surface regions 7 comprising all exposed surfaces of the semiconductor component 10 and the electrical contact element 21, the semiconductor component 10 is covered and sealed in a hermetically impermeable manner with the sealing material 6 applied by atomic layer deposition. Furthermore, surfaces 17 of the carrier are also covered with the sealing material 6. A comprehensive encapsulation of the semiconductor component 10 is thereby achieved.

In comparison with the known housings, very compact dimensions of the encapsulated optoelectronic component 600 can be obtained by virtue of the sealing material 6. This is advantageous precisely in combination with the electrical contact-connection by the layered electrical contact element 21 shown since the typically employed electrical connections between a semiconductor chip and the electrical leads in the form of bonding wires, with the omission of a known housing, would contribute significantly to the structural height. In comparison to an electrical contact element 21 embodied as a bonding wire, the risk of damage to the optoelectronic component 600, for example, as a result of the bonding wire being torn away is furthermore also reduced in the case of the housing-free design shown.

FIG. 10 shows an optoelectronic component 700 comprising a semiconductor component 10 in accordance with a further example which, in comparison to the previous example, has a bonding wire as electrical contact element 21. In this case, the entire semiconductor component 10 on all exposed surfaces or surface regions 7 and also the bonding wire 21 are covered with the sealing material 6. Furthermore, the carrier with the electrical connection layers 15, 16, apart from a connection region 22, is also covered on all surfaces 17 with the sealing material 6 such that a comprehensive sealing of the optoelectronic component 700 is achieved. With the electrical connection region 22, in which the electrical connection layers 15, 16 are accessible for contact-connection, the optoelectronic component 700 can be electrically connected to an external power supply and/or control electronics.

Furthermore, the optoelectronic component 700 comprises a transparent housing material 20 surrounding the semiconductor component 10 and a part of the carrier 11. The housing material 20 comprises a plastic that is not hermetic.

Conventional encapsulation of optoelectronic components in a hermetic plastic housing or metal housing, by contrast, would be very complicated in comparison to the example shown since all interfaces with respect to the surroundings have to meet very stringent requirements with regard to impermeability which can only be realized by relatively complicated methods and materials. The housing itself could in many cases be embodied significantly more simply, in particular to meet other requirements such as for instance, handleability, heat dissipation and/or optical properties, if a hermetic encapsulation need not also be formed by the housing in the usual way. By virtue of the combination with the sealing material 6, significantly simpler housings can be used, in which case a hermetically impermeable sealing is indeed ensured, but at the same time the complicated known methods and materials for encapsulation can be avoided.

Figure 11:
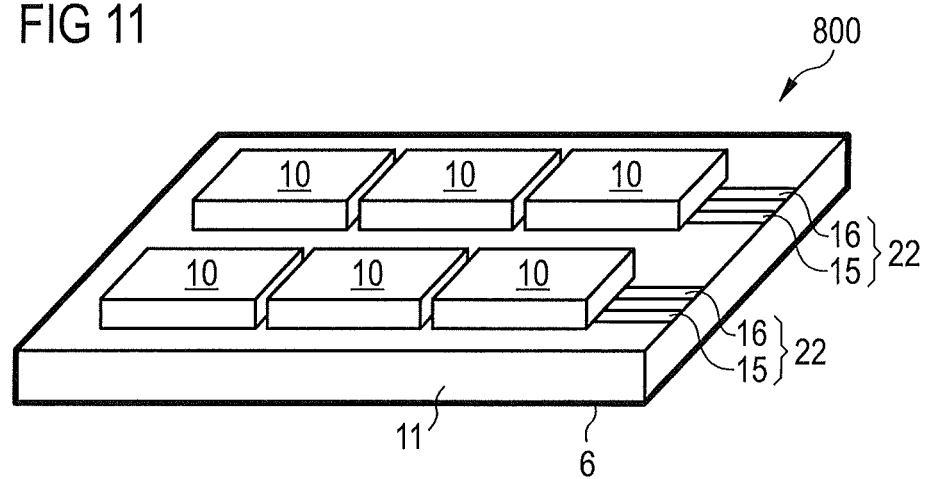

FIG. 11 shows an optoelectronic component 800 in accordance with a further example, which comprises a plurality of semiconductor components 10 on a carrier 11 which is a heat sink, leadframe, circuit board or panel. In the example shown here the semiconductor components 10 are LEDs such that the optoelectronic component 800 constitutes a light-emitting high-power module. The semiconductor components 10 are covered jointly with the carrier 11 on every exposed surface continuously with the sealing material 6 as indicated schematically in FIG. 11. Only the electrical connection tracks 15, 16 are an electrical connection region in the region shown and are therefore free of a sealing material 6.

The sealing material 6 applied by atomic layer deposition affords a particular advantage in the case of optoelectronic components like that shown here primarily also when the semiconductor components 10 are arranged very densely alongside one another, for instance in an array design. In this case, atomic layer deposition makes it possible to apply a cost-effective, large-area, optically transparent and hermetically impermeable sealing or encapsulation which also reliably and uniformly seals narrow gaps possibly present between the semiconductor components 10. In this case, the sealing material 6 can advantageously comprise an optically transparent material that does not influence the optical functionality of the semiconductor components 10.

Alternatively, the semiconductor components 10 can also at least in part or all be laser diodes and/or photodiodes. Furthermore, it is also possible for the application of the sealing material by atomic layer deposition to be carried out in the context of mounting the semiconductor components 10 and the electrical connection tracks thereof on a panel. Afterwards, mounting additional components such as optical devices, for instance, requiring no encapsulation can then be possible.

Figure 12:
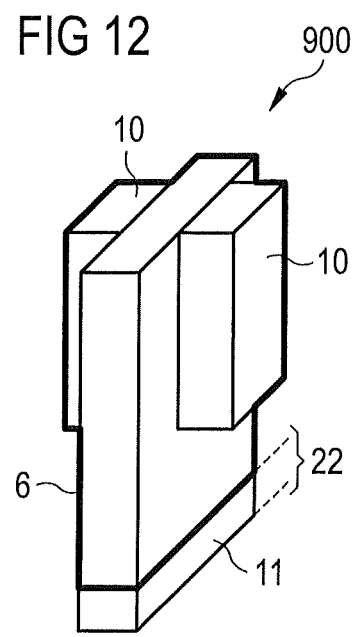

FIG. 12 shows an optoelectronic component 900 in accordance with a further example which comprises two semiconductor components 10 on a carrier 11 which is an electrical connection plate and at the same time as a heat sink, the semiconductor components being arranged on different surfaces of the carrier 11. In the example shown here the semiconductor components 10 are embodied purely by way of example as red and green laser diodes. For the sake of clarity, electrical contact layers and connection layers are not shown. Apart from an electrical connection region 22, the semiconductor components 10 and the carrier 11 are covered on all exposed surfaces continuously with the sealing material 6 as is indicated schematically in FIG. 12. This enables a joint and simultaneous encapsulation of the different semiconductor components 10 in conjunction with a very compact design of the optoelectronic component 900 since a complicated encapsulation in accordance with the prior art such as, for instance, an inert gas housing can be dispensed with. On account of the compact design, the semiconductor components 10 can, for example, also utilize a common optical unit disposed downstream.

As an alternative to the example shown of a so-called "transmitter-transmitter" combination, the semiconductor components 10 can also be, for example, LEDs or a combination of a photodiode and a light-emitting diode or a laser diode in a transmitter-receiver combination. As an alternative thereto, the semiconductor components 10 can also be two photodiodes in a receiver-receiver combination. Furthermore, it is also possible for more than the two semiconductor components 10 shown and also further electronic components to be arranged on the carrier 11 on one or both sides and to be encapsulated jointly with the sealing material 6.

The compact design shown is advantageous for optoelectronic mass applications such as, for instance, projectors or light barriers, since identical or different types of semiconductor components 10 can be geometrically densely packed and encapsulated jointly without further space taken up.

FIG. 13 shows an optoelectronic component 1000 in accordance with a further example which is a solar cell panel or a solar cell module. The optoelectronic component 1000 comprises a plurality of semiconductor components 10 which are solar cells and arranged jointly on a carrier 11 and electrically interconnected with one another. The semiconductor components 10 are jointly covered with the sealing material 6 in a hermetically impermeable manner and thus protected against scratching and environmental influences such as, for instance, hail, dust, moisture and oxygen.

Solar cells and solar cell modules are acquiring increasing importance for future energy supply. Since the failure of individual solar cells or of a solar cell module is associated with considerable costs, such systems must have a long lifetime with as far as possible undiminished efficiency. By virtue of the sealing material 6 applied in a large-area fashion and continuously over the semiconductor components 10 embodied as solar cells, the sealing material in the form of a transparent weather-protection encapsulation, affords effective protection against environmental influences and, for example, also prevents electrical contact layers or connection layers from corroding as a result of moisture.

Our components and methods are not restricted to the examples by the description on the basis thereof. Rather, this disclosure encompasses any novel feature and also any combination of features, which in particular includes any combination of features in the appended claims, even if the feature or combination itself is not explicitly specified in the patent claims or the examples.

The invention claimed is:

1. An optoelectronic component comprising:
   at least one inorganic optoelectronically active semiconductor component having an active region that emits or receives light during operation, and
   a sealing material directly applied by atomic layer deposition, wherein the semiconductor component is applied on a carrier, the carrier comprises electrical connection layers, the semiconductor component electrically connects to one of the electrical connection layers via an electrical contact element which is a bonding wire, and the sealing material completely covers in a hermetically impermeable manner and directly contacts all exposed surfaces including sidewall and bottom surfaces of the semiconductor component, the bond wire, and all exposed surfaces of the carrier apart from an electrical connection region of the carrier.

2. The component according to claim 1, wherein the semiconductor component is applied with a mounting area on the carrier.

3. The component according to claim 1, wherein the semiconductor component and the sealing material are at least partly enclosed with a housing material.

4. The component according to claim 1, wherein
   the optoelectronic component has a plurality of semiconductor components, and
   the sealing material is applied on at least one surface region of each of the plurality of semiconductor components.

5. The component according to claim 1, wherein
   the semiconductor component has at least one micro-opening in at leastone surface region, and
   the sealing material seals the micro-opening.

6. The component according to claim 5, wherein the surface region having the at least one micro-opening is part of a surface of a substrate and/or of an epitaxially grown layer of a semiconductor layer sequence.

7. The component according to claim 5, wherein
   the semiconductor component has a passivation layer and/or a growth protection layer, and
   the surface region having the at least one micro-opening is part of a surface of the passivation layer and/or of the growth protection layer.

8. The component according to claim 1, wherein a surface of the semiconductor component is at least partly shaded.

9. A method for producing the optoelectronic component according to claim 1 comprising a semiconductor component comprising:
   applying the sealing material to a semiconductor layer assemblage by atomic layer deposition, and
   singulating the semiconductor layer assemblage into a plurality of semiconductor components.

10. A method for producing the optoelectronic component according to claim 1 comprising a semiconductor component, comprising:
   mounting the semiconductor component on a carrier, and
   depositing the sealing material atomic layer deposition.

* * * * *

UNITED STATES PATENT AND TRADEMARK OFFICE
CERTIFICATE OF CORRECTION

PATENT NO. : 9,508,903 B2
APPLICATION NO. : 13/516915
DATED : November 29, 2016
INVENTOR(S) : Fehrer et al.

It is certified that error appears in the above-identified patent and that said Letters Patent is hereby corrected as shown below:

In the Claims

In Column 20
At Line 6, please change "leastone" to --least one--; and at Line 31, please insert --by-- after "material".

Signed and Sealed this
Seventh Day of March, 2017

Michelle K. Lee
*Director of the United States Patent and Trademark Office*